(12) United States Patent
Sugino

(10) Patent No.: US 8,035,978 B2
(45) Date of Patent: Oct. 11, 2011

(54) PRINTED CIRCUIT BOARD, FABRICATION METHOD AND APPARATUS

(75) Inventor: Shigeru Sugino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 367 days.

(21) Appl. No.: 12/199,489

(22) Filed: Aug. 27, 2008

(65) Prior Publication Data

US 2009/0080168 A1    Mar. 26, 2009

(30) Foreign Application Priority Data

Sep. 25, 2007    (JP) .................. 2007-247319

(51) Int. Cl.
*H05K 1/18*    (2006.01)

(52) U.S. Cl. ........................................ 361/761; 174/262
(58) Field of Classification Search .................. 174/262, 174/255, 258; 361/760, 761
See application file for complete search history.

(56) References Cited

U.S. PATENT DOCUMENTS

| 2007/0263339 A1* | 11/2007 | Sugioka et al. | 361/305 |
| 2010/0142170 A1* | 6/2010 | Kim et al. | 361/762 |
| 2010/0277881 A1* | 11/2010 | Russell | 361/761 |

FOREIGN PATENT DOCUMENTS

| JP | 2001-210955 | | 8/2001 |
| JP | 2001210955 | * | 8/2001 |
| JP | 2001210955 A1 | * | 8/2001 |
| JP | 2006-59852 | | 3/2006 |
| JP | 2006-196785 | | 7/2006 |

* cited by examiner

*Primary Examiner* — Yuriy Semenenko
(74) *Attorney, Agent, or Firm* — Staas & Halsey LLP

(57) ABSTRACT

A printed circuit board includes a mounted a first electronic component. The printed circuit board includes a first through holes extending from a mounting surface on which the electronic component is mounted. The printed circuit board includes a second through holes extending from a surface opposite the mounting surface and aligned with the first through holes. A second electronic component may be longitudinally between the first through holes and the second through holes. The first and second through holes may be electrically connected with the second electronic component.

3 Claims, 5 Drawing Sheets

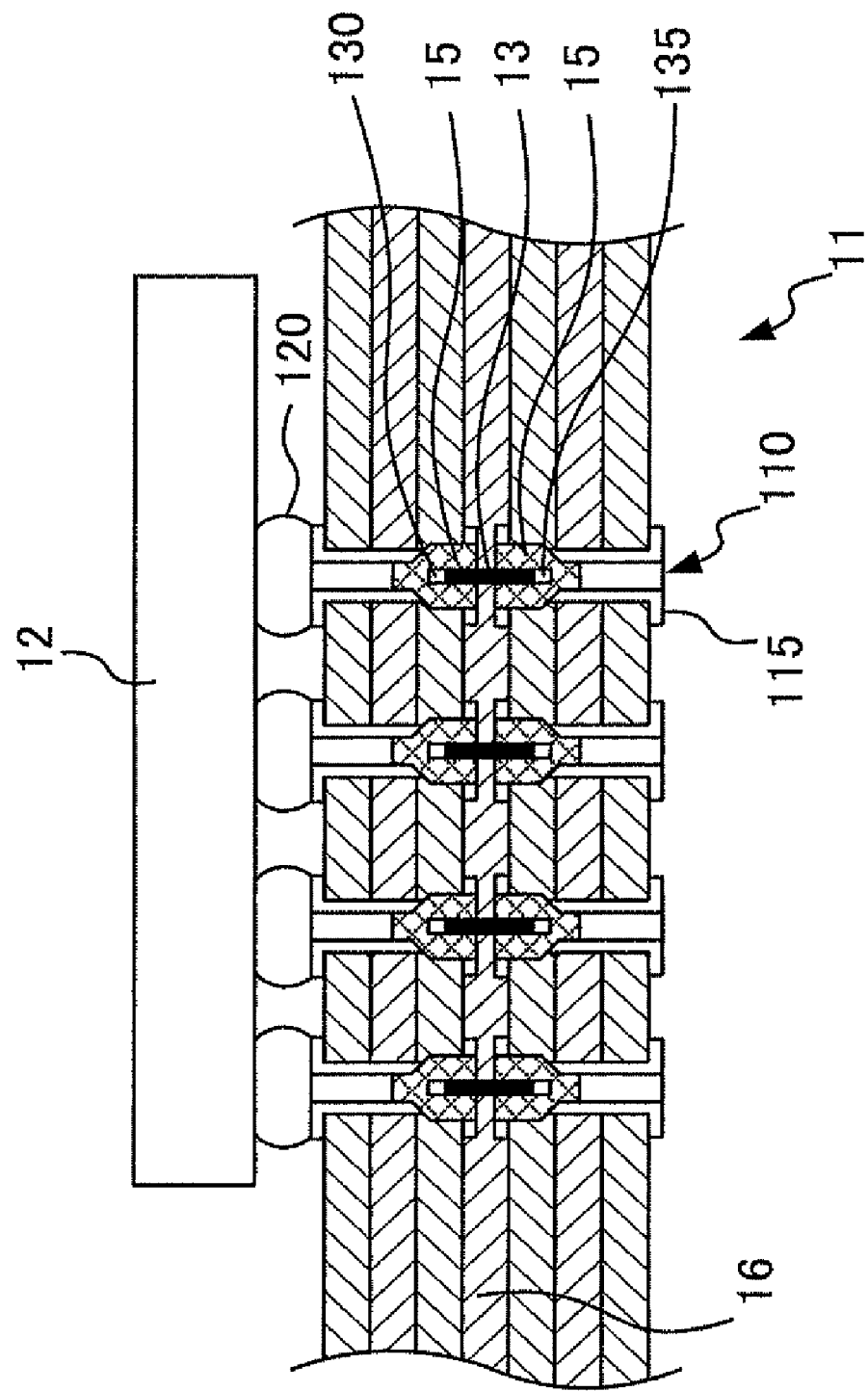

PRINTED CIRCUIT BOARD, FABRICATION METHOD AND APPARATUS

CROSS-REFERENCE TO RELATED APPLICATIONS

This application is related to and claims priority to Japanese patent application no. 2007-247319 filed on Sep. 25, 2007, in the Japan Patent Office, and incorporated by reference herein.

BACKGROUND

1. Field

The embodiments discussed herein are related to a printed circuit board having a mounted a semiconductor device thereon and mounted accessory electronic components of the semiconductor device. The electronic components may be mounted on the printed circuit board in the vicinity of the semiconductor device. However, the periphery of the semiconductor device is limited. To equip more electronic components, a method for burying the electronic components in the printed circuit board has been proposed.

FIG. 1 is a sectional diagram showing a part of a conventional printed circuit board having the electronic components mounted thereon. A printed circuit board 1 illustrated in FIG. 1 is a multilayer board, a BGA type semiconductor device 2 mounted thereon. A solder ball 20 used as an external connection electrode of the semiconductor device 2 connects to a through hole (via hole) 10 penetrating the printed circuit board 1, thereby leading the solder ball 20 to an electrode pad 15 formed on the underside of the printed circuit board.

The electrode pad 15 on the underside of the printed circuit board 1 may connect with an electrode 3a of an electronic component 3 such as a chip resistor or a chip capacitor. The electronic component 3 such as the chip resistor or the chip condenser may be located in alignment with each electrode of the semiconductor device 2. Such electronic components are often called di-electrode components. The printed circuit board 1 shown in FIG. 1 in addition is equipped with an electronic component 4 buried therein. The electronic component 4 is buried in an insulation layer of the printed circuit board 1 and an electrode 40 formed on an end of the electronic component 4 connects to the electrode (the solder ball 20) of the semiconductor device 2 with an interstitial via hole (IHV) 1c.

As shown in FIG. 1, a technique to bury the electronic component (here, an electronic component 4) in a perforation of a prepreg layer used as a bonding layer of the printed circuit board has been presented.

Typical electronic components 3 and 4 such as the chip resistor and the chip capacitor are in the elongated shape and have electrodes on both ends of their longer sides. As shown in FIG. 1, the electronic components 3 and 4 may be located so as to be parallel with their longer sides to the surface of the printed circuit board 1. Therefore, the electronic components 3 and 4 occupy more area (footprint), which limits the number of the electronic components 3 and 4 that can be mounted d on or in the printed circuit board 1.

2. Description of the Related Art

To address this problem, a technique to form through holes that are not the through holes for wiring, in the multilayer printed circuit board and insert the electronic components therein has been proposed. With this technique, the electronic components longitudinally align in the height direction of the multilayer printed circuit board so that the footprints of the electronic components will be smaller.

SUMMARY

It is an aspect of the embodiments discussed herein to provide a printed circuit board having a mounted electronic component, a fabrication method and an apparatus.

The above aspects can be attained by a system that includes a printed circuit board having a first electronic component mounted thereon, the printed circuit board including a first through hole extending from a mounting surface on which said first electronic component is mounted; a second through hole extending from an opposite surface of said mounting surface, aligned with said first through hole; and a second electronic component between said first through hole and said second through hole, said second electronic component longitudinally in alignment with the first and second through holes, and said first and second through holes electrically connected with said second electronic component.

These together with other aspects and advantages which will be subsequently apparent, reside in the details of construction and operation as more fully hereinafter described and claimed, reference being had to the accompanying drawings forming a part hereof, wherein like numerals refer to like parts throughout.

Additional objects and advantages of the embodiment will be set forth in part in the description which follows, and in part will be obvious from the description, or may be learned by practice of the embodiment. The object and advantages of the embodiment will be realized and attained by means of the elements and combinations particularly pointed out in the appended claims.

It is to be understood that both the foregoing general description and the following detailed description are exemplary and explanatory only and are not restrictive of the embodiment, as claimed.

BRIEF DESCRIPTION OF THE DRAWINGS

FIG. 2 is a sectional diagram illustrating a part of a printed circuit board according to an example embodiment.

DETAILED DESCRIPTION OF THE EMBODIMENTS

FIG. 2 illustrates a printed circuit board according to an example embodiment.

Figure 1:
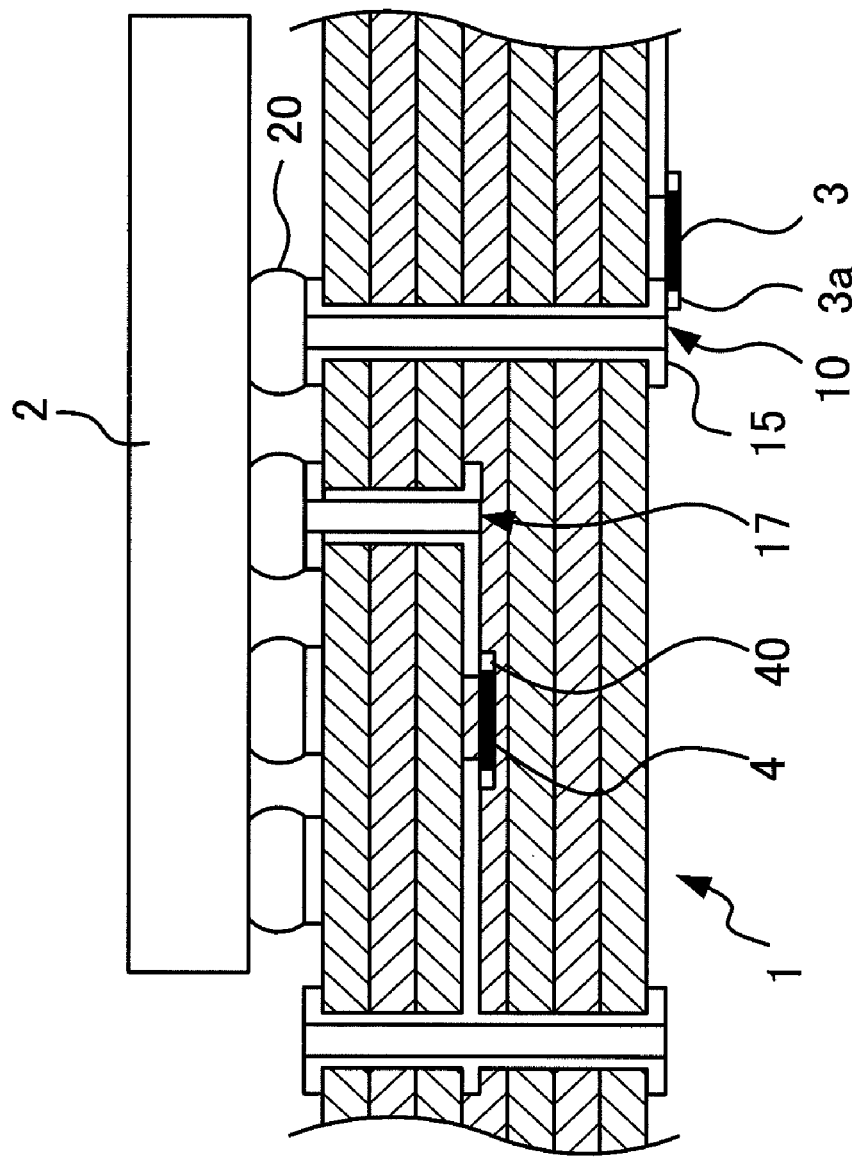
FIG. 1 is a sectional diagram of a conventional printed circuit board having an electronic component mounted thereon.

For a printed circuit board 11 according to an example embodiment, a semiconductor device 12 may be mounted on the printed circuit board 11 as a first electronic component in common with the conventional printed circuit board shown in FIG. 1. However, the structure to bury the electronic components 13 as second electronic components in the printed circuit board 11 may differ from that of the conventional printed circuit board.

The printed circuit board 11 illustrated in FIG. 2 is a multilayer printed circuit board, and a BGA type semiconductor device 12 is mounted on a mounting surface of the printed circuit board 11. The solder balls 120 used as external connection electrodes of the semiconductor device 12 may be connected to through holes (via holes) 110 formed in the printed circuit board 11 and further connected to electrode pads 115 formed on the underside of the printed circuit board 11 with the through holes 110.

In this example embodiment, hollow spaces (cavities) larger than the through holes 110 in bore diameter may be formed in the middle of the through holes 110 and the electronic components 13 may be situated in the hollow spaces. The electronic components 13 may be the chip components typically in the elongated shape such as the chip resistor or the chip capacitor and the electrodes may be formed on the both ends of their longer sides. The electronic components 13 may be longitudinally situated in the alignment with a direction on which the hollow spaces formed in the middle of the through holes 110 length.

Since, the through holes 110 can act as wirings connected to the electrodes (solder balls 120) of the semiconductor device 12, the electronic components 13 may be connected in series with the electrodes (solder balls 120) of the semiconductor device 12. In other words, in the hollow space formed in the middle of the through hole 110, the electrode 130 formed on one end of the electronic component 13 may be connected with the through hole 110 that connects with the electrode of the semiconductor device 12 electrically with a conductive cementing material 15 such as a conductive paste. Likewise, the electrode 135 on the other end of the electronic component 13 may be electrically connected to the electrode pad 115 formed on the underside of the printed circuit board 11 with the conductive cementing paste 15 such as the conductive paste. Furthermore, near the center of the electronic component 13, an insulation resin layer 16 may be inserted not to contact the conductive cementing material 15 for cementing the both ends of the electronic component 13 each other.

In the printed circuit board 11 with such structure enables to situate the electronic component 13 per through holes 110. More specifically, the electronic components 13 may be situated in the printed circuit board 11 with they cemented in the middle of each through holes 110, so that each through holes 110 can have the electronic component 13. Therefore, the number of the electronic components 13 to be buried in the printed circuit board 11 can increase. Furthermore, inserting the electronic components 13 in the middle of the through holes 110 longitudinally makes more space available for other wiring, extending the possibility of the wiring in the printed circuit board 11.

Referring to FIG. 3A-3F, the fabrication method for the printed circuit board 11 illustrated in FIG. 2 will be discussed. FIG. 3A-3F illustrate an example fabrication method of the example printed circuit board 11.

The printed circuit board 11 may be fabricated by bonding two printed circuit boards 100 and 105. The printed circuit boards 100 and 105 can be any substrates that allow forming the through holes therein, for example, a glass epoxy substrate or a polyimide substrate can be used. Further, the two printed circuit board components 100 and 105 are not necessarily multilayer substrates. Bi-layer substrates can be used as the printed circuit board components 100 and 105, e.g., if they have substantial thicknesses.

Figure 3A:
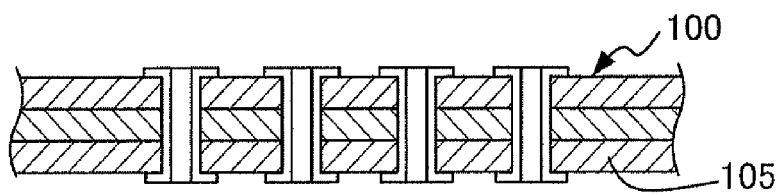
FIGS. 3A-3F illustrate a fabrication method according to an example embodiment.

As per FIG. 3A, first through holes 101 and second through holes 102 may be formed in a first printed circuit board 100 and a second printed circuit board 105. For convenience, FIG. 3A-FIG. 3F show only the printed circuit board 105. The first and the second through holes 101 and 102 may be formed at the regular intervals (e.g., 1 mm) equal to the distance between the electrodes (solder balls 120) of the semiconductor device 12 (the first electronic component) mounted on the printed circuit board 11.

Figure 3B:
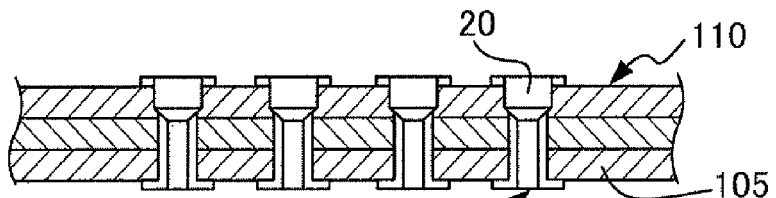

After forming the through holes 101 and 102 in the printed circuit boards 100 and 105, first holes 300 and second holes 400 may be formed at the ends of the through holes 101 and 102 formed in the printed circuit board 100 and 105 as illustrated in FIG. 3B. The first and the second holes 300 and 400 may be equivalent to the hollow spaces (cavities) in which the electronic components 13 illustrated in FIG. 2 may be inserted. The bore diameters of the first and second holes 300 and 400 may be larger than the bore diameter of the through holes 101 and 102, enabling to house the electrodes 130 and 135 of the electronic components 13. The bore diameter of the holes 300 and 400 depend on the dimension of the electronic component housed therein. For instance, where the bore diameter of the through holes 101 and 102 may be 0.2 mm-0.5 mm, the bore diameters of the holes 300 and 400 may be on the order of 0.5 mm-0.6 mm.

According to an embodiment holes 300 and 400 may be processed with a drill slightly larger in outer dimension than in bore diameter of the through holes 101 and 102. However, the processing is not limited to the drilling. The depths of the holes 300 and 400 may be determined depends on the length of the electronic component 13 housed therein.

In FIG. 3A-3F, holes 300 and 400 may be formed at the ends of all through holes 101 and 102. However, according to an embodiment it is not necessary to form the holes 300 and 400 may be not formed at the ends of all through holes 101 and 102. The holes 300 and 400 may be formed at through holes 101 and 102 for electronic components 13.

Figure 3C:
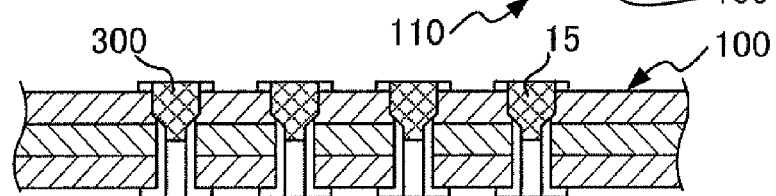
Figure 3D:
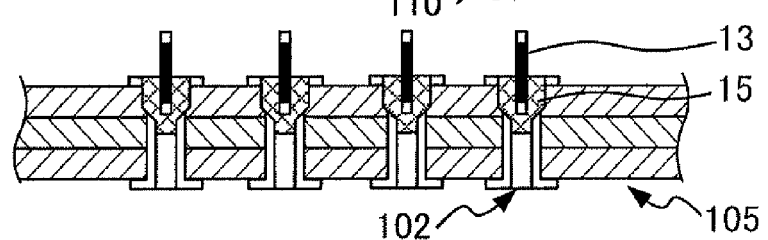
Figure 3E:
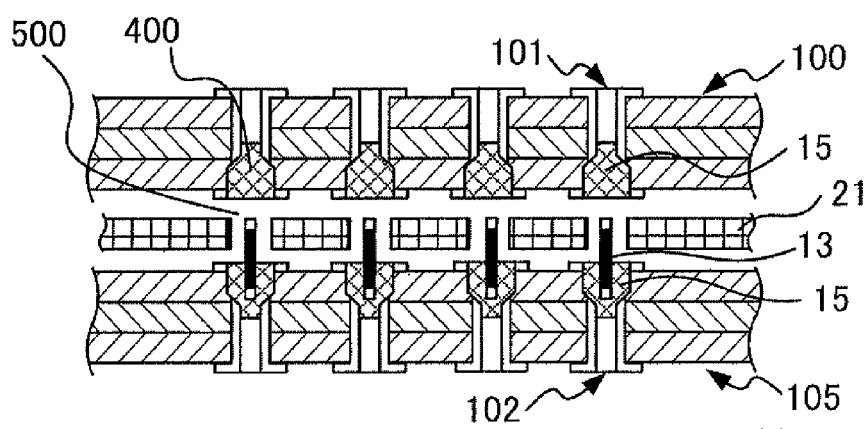
Figure 3F:
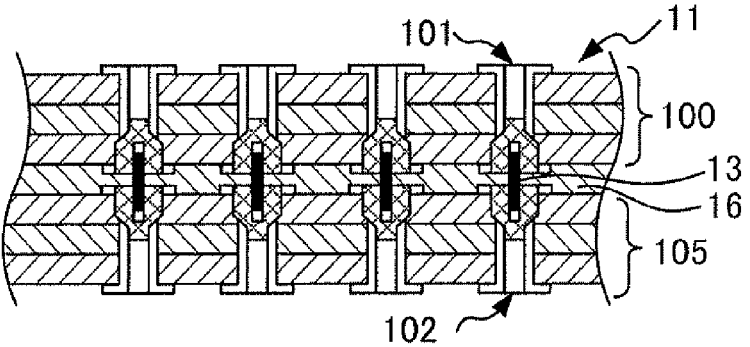

After forming the holes 300 and 400 in the printed circuit board components 100 and 105, the holes 300 and 400 may be filled with thermosetting conductive paste as the conductive cementing material 15 therein as illustrated in FIG. 3C. The electrode 135 of the electronic component 13 may be inserted into the conductive cementing material 15 filled in the hole 400 formed in the printed circuit board component 105 (one of the printed wiring board components) as illustrated in FIG. 3D, and then the conductive cementing material 15 may be precured (make the conductive cementing material 15 to a half-hard condition) by heat together with the conductive cementing material 15 filled in the holes 300 formed in the printed circuit board 100.

The prepreg 21 made of a half-hard insulation resin may be inserted between the printed circuit boards 100 and 105. In the prepreg 21, perforations 500 may be formed at the positions corresponding to the situations of the electronic components 13 therein the ends of the electronic components 13 protruding from the printed circuit board 100 pass through to the printed circuit board 105. In this embodiment, the prepreg 21 may be made of the thermosetting insulation resin.

The printed circuit board components 100 and 105 may be bounded by pressing with the prepreg 21 sandwiching. Thereby, the projecting portions of the electronic components 13 may be inserted into the conductive cementing material 15 filled in the holes 400 formed in the printed circuit board 105 while in filling the holes 400 with the prepreg 21 pressed. Thereafter, the conductive cementing material 15 and the prepreg 21 may be heated to be hardened completely, thereby fabricated the printed circuit board 11 illustrated in FIG. 2. The prepreg 21 between the printed circuit boards 100 and 105 is an insulation layer 16 upon hardening. The through hole 101 may be aligned with the through hole 102, and upon joining a an example through hole 110 as illustrated in FIG. 2, will result.

Figure 4:
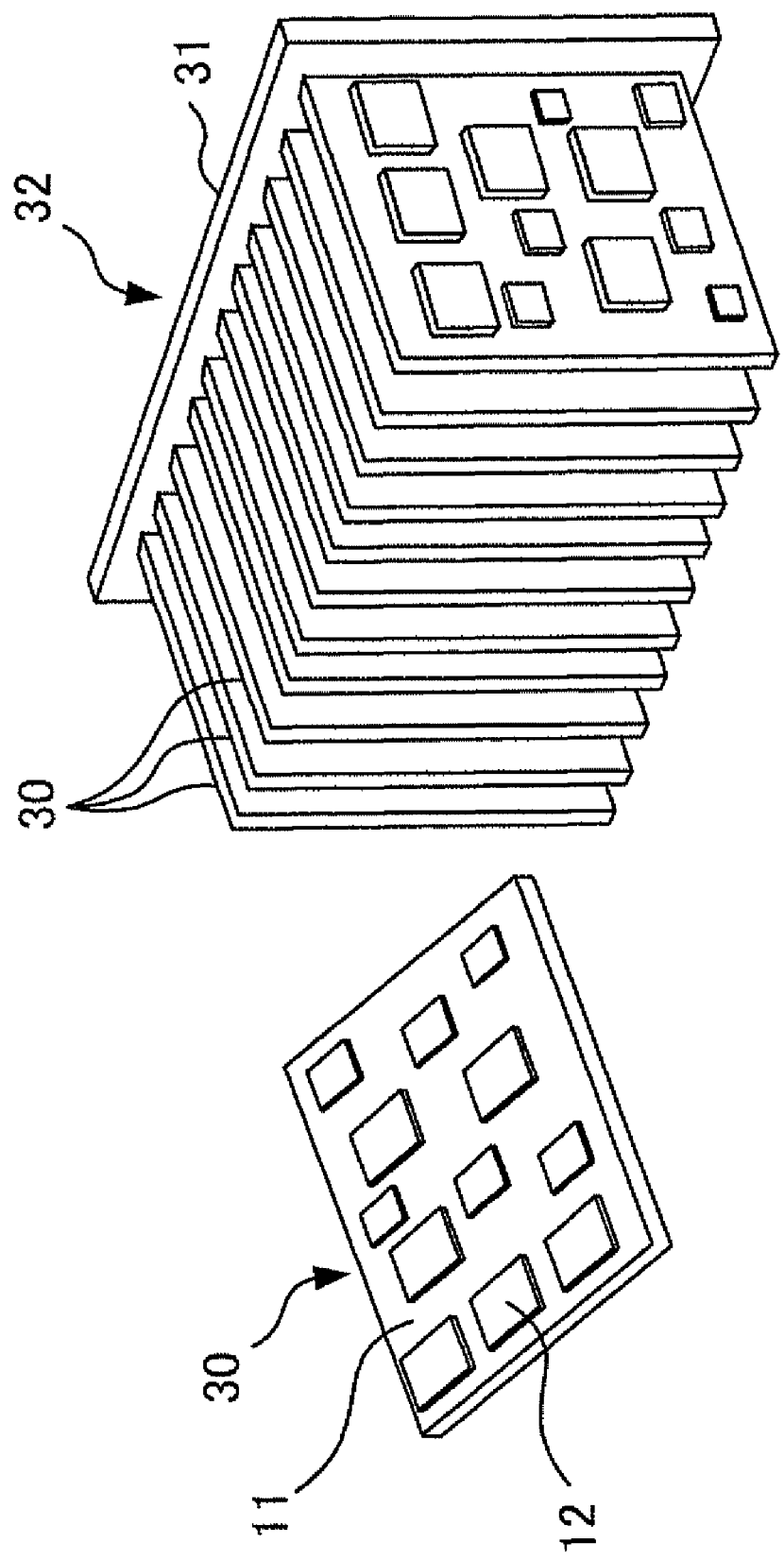
FIG. 4 illustrates a plug-in unit packaging a set of printed circuit boards according to an embodiment.

The semiconductor device 12 and other electronic components may be mounted on or buried in the printed circuit board 11 fabricated in the manner described above, thereby obtained a printed circuit board unit (called a package) 30 illustrated in FIG. 4. In FIG. 4, a plug-in unit 32 may be obtained by packaging a set of the packages 30 with a back panel 31 providing an electrical connection.

Figure 5:
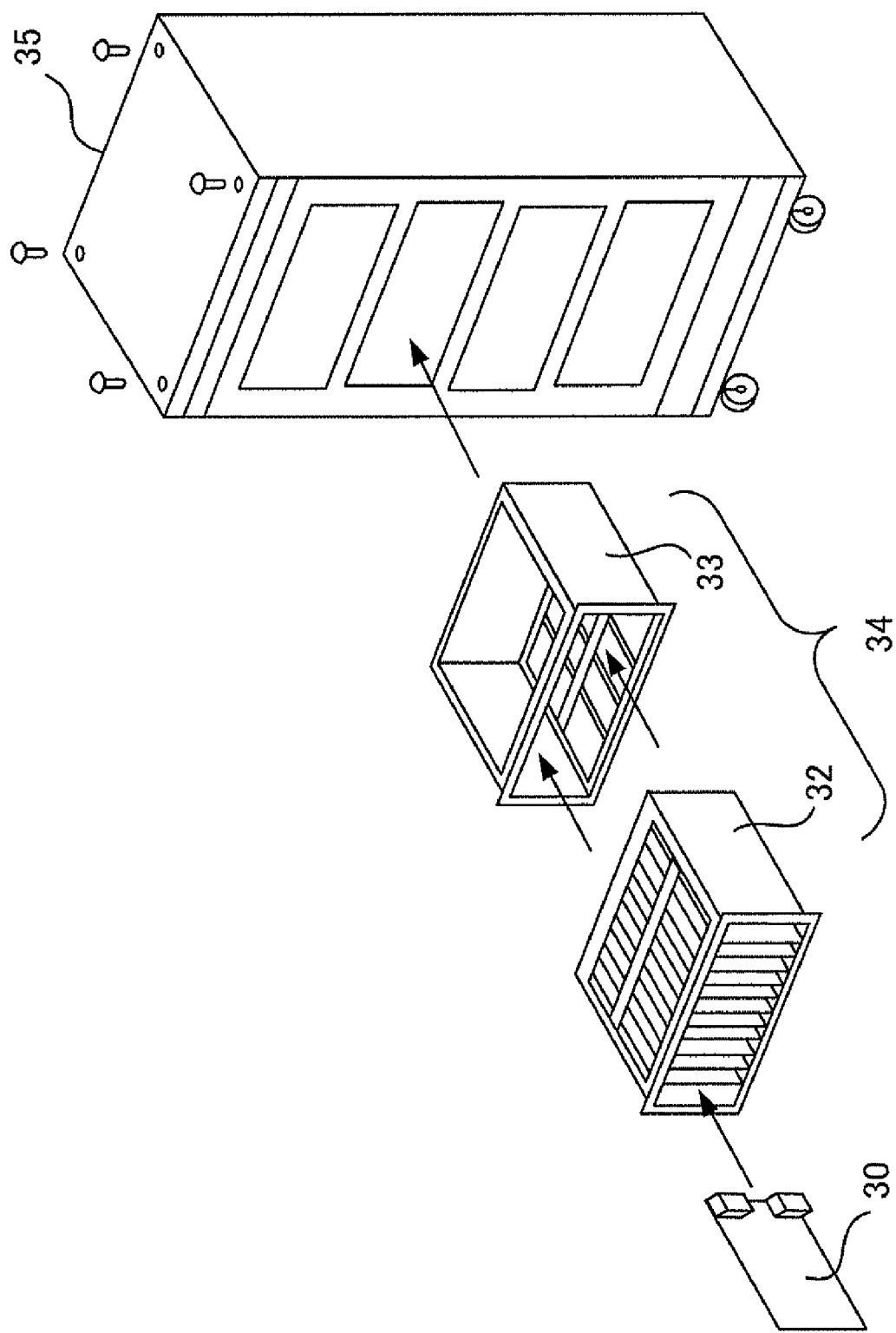
FIG. 5 illustrates a communication apparatus equipping a plug-in unit

The plug-in unit 32 may be stored in a sub rack 33 and the sub rack 33 may be stored in a rack constructing a communication apparatus 35 as a circuit of the communication apparatus as illustrated in FIG. 5. The printed circuit board 11 in this embodiment is not limited to the use for communication devices, but in addition for any apparatuses that equip the printed circuit board units comprising a set of the printed circuit boards.

Further, according to an aspect of the embodiments, any combinations of the described features, functions and/or operations can be provided.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A printed circuit board having a first electronic component mounted thereon, and having a mounting surface and an opposite surface, the opposite surface being opposite of the mounting surface, the first electronic component being mounted on the mounting surface, the printed circuit board comprising: a first through hole having a first end and a second end, the first end being exposed on the mounting surface, and extending from the mounting surface; a second through hole having a third end and a fourth end, the third end being exposed on the opposite surface, and extending from the opposite surface; and a second electronic component between the second end of said first through hole and the fourth end of said second through hole, said second electronic component longitudinally in alignment with the first and second through holes, wherein said first and second through holes are electrically connected with said second electronic component, wherein said second electronic component having a first electrode and a second electrode on both ends, and said first electrode of said second electronic component is connected to the second end of said first through hole with a conductive cementing material, and said second electrode of said second electronic component is connected to the fourth end of said second through hole with the conductive cementing material.

2. The printed circuit board according to claim 1, further comprising an insulation resin layer inserted between said conductive cementing material cementing said first electrode in said first through hole and said conductive cementing material cementing said second electrode in said second through hole.

3. An apparatus equipping the printed circuit board according to claim 1.

* * * * *